United States Patent
Kang

(10) Patent No.: US 8,791,479 B2
(45) Date of Patent: Jul. 29, 2014

(54) LIGHT EMITTING DEVICE AND METHOD FOR MANUFACTURING THE SAME

(71) Applicant: LG Innotek Co., Ltd., Seoul (KR)

(72) Inventor: Dae Sung Kang, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/721,772

(22) Filed: Dec. 20, 2012

(65) Prior Publication Data

US 2013/0193442 A1     Aug. 1, 2013

Related U.S. Application Data

(63) Continuation of application No. 12/678,103, filed as application No. PCT/KR2009/002448 on May 8, 2009, now abandoned.

(30) Foreign Application Priority Data

May 8, 2008 (KR) .................. 10-2008-0042973

(51) Int. Cl.
    *H01L 29/205*     (2006.01)

(52) U.S. Cl.
    USPC .......... 257/91; 257/98; 257/99; 257/E33.067; 257/E33.074; 438/46; 438/47

(58) Field of Classification Search
    USPC ......... 257/98, 99, E33.067, E33.074; 438/46, 438/47

See application file for complete search history.

(56) References Cited

U.S. PATENT DOCUMENTS

| | | | |
|---|---|---|---|
| 5,281,830 A | 1/1994 | Kotaki et al. | |
| 6,221,684 B1 * | 4/2001 | Sugawara et al. | 438/47 |
| 6,960,485 B2 | 11/2005 | Uemura et al. | |
| 2002/0024055 A1 | 2/2002 | Uemura et al. | |
| 2005/0093002 A1 | 5/2005 | Tsai et al. | |
| 2005/0205875 A1 | 9/2005 | Shei et al. | |
| 2006/0054908 A1 * | 3/2006 | Sai et al. | 257/96 |
| 2006/0270074 A1 | 11/2006 | Kim | |
| 2007/0023763 A1 * | 2/2007 | Takigawa et al. | 257/79 |
| 2008/0280386 A1 | 11/2008 | Kawasaki et al. | |

FOREIGN PATENT DOCUMENTS

| | | |
|---|---|---|
| CN | 1284751 A | 2/2001 |
| KR | 10-2006-0121422 A | 11/2006 |
| KR | 10-2006-0134491 A | 12/2006 |
| KR | 2007-96116 A | 4/2007 |
| KR | 10-2007-0088006 A | 8/2007 |
| KR | 10-2008-0000884 A | 1/2008 |

* cited by examiner

*Primary Examiner* — Su Kim
(74) *Attorney, Agent, or Firm* — Birch, Stewart, Kolasch & Birch, LLP

(57) ABSTRACT

Provided are a light emitting device and a method for manufacturing the same. The light emitting device comprises a first conductive type semiconductor layer, an active layer, a second conductive type semiconductor layer, and a light extraction layer. The active layer is formed on the first conductive type semiconductor layer. The second conductive type semiconductor layer is formed on the active layer. The light extraction layer is formed on the second conductive type semiconductor layer. The light extraction layer has a refractive index smaller than or equal to a refractive index of the second conductive type semiconductor layer.

18 Claims, 3 Drawing Sheets

LIGHT EMITTING DEVICE AND METHOD FOR MANUFACTURING THE SAME

CROSS-REFERENCE TO RELATED APPLICATIONS

This application is a continuation of co-pending U.S. application Ser. No. 12/678,103 filed on Mar. 12, 2010, which claims priority under 35 U.S.C. 119(a) to Korean Patent Application No. 10-2008-0042973 filed on May 8, 2008 which is hereby incorporated by reference in its entirety.

TECHNICAL FIELD

The present disclosure relates to a light emitting device and a method for manufacturing the same.

BACKGROUND ART

Recently, studies are being actively conducted on a Light Emitting Diode (LED) as a light emitting device.

LED includes a first conductive type semiconductor layer, an active layer, and a second conductive type semiconductor layer. Light is generated by combination of electrons and holes in the active layer when power is applied to the first conductive type semiconductor layer and the second conductive type semiconductor layer.

LEDs are used for various machines and electrical and electronic devices such as display devices, lighting devices, mobile communication terminals, and automobiles.

DISCLOSURE OF THE INVENTION

Technical Problem

Embodiments provide a light emitting device and a method for manufacturing the same.

Embodiments provide a light emitting device and a method for manufacturing the same, which has improved light extraction efficiency.

Technical Solution

In one embodiment, a light emitting device comprises: a first conductive type semiconductor layer; an active layer on the first conductive type semiconductor layer; a second conductive type semiconductor layer on the active layer; and a light extraction layer on the second conductive type semiconductor layer, the light extraction layer having a refractive index smaller than or equal to a refractive index of the second conductive type semiconductor layer.

In another embodiment, a method for manufacturing a light emitting device comprises: forming a first conductive type semiconductor layer, an active layer, and a second conductive type semiconductor layer; forming a selectively patterned mask layer on the second conductive type semiconductor layer; forming a light extraction layer on the second conductive type semiconductor layer on which the mask layer is not formed and removing the mask layer; performing a scribing process around the light extraction layer; and selectively etching the second conductive type semiconductor layer, the active layer, and the first conductive type semiconductor layer to upwardly expose a portion of the first conductive type semiconductor layer.

The details of one or more embodiments are set forth in the accompanying drawings and the description below. Other features will be apparent from the description and drawings, and from the claims.

Advantageous Effects

The embodiments can provide a light emitting device and a method for manufacturing the light emitting device.

The embodiments can provide a light emitting device and a method for manufacturing the light emitting device, which has improved light extraction efficiency.

BEST MODE FOR CARRYING OUT THE INVENTION

Figure 1:
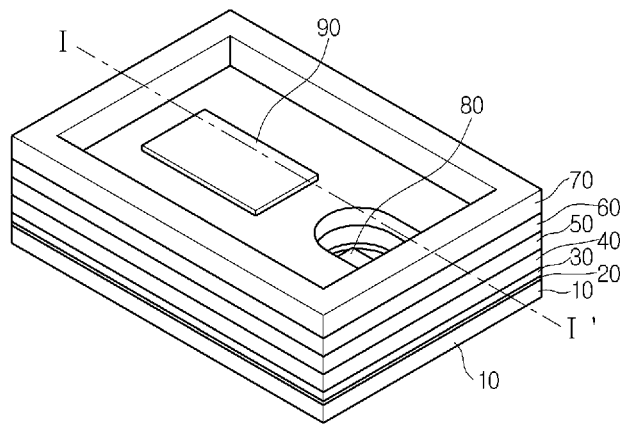
FIG. 1 is a perspective view of a light emitting diode according to a first embodiment.

Reference will now be made in detail to the embodiments of the present disclosure, examples of which are illustrated in the accompanying drawings.

In the descriptions of embodiments, it will be understood that when a layer (or film), a region, a pattern, or a structure is referred to as being "on/under" a substrate, a layer (or film), a region, a pad, or patterns, it can be directly on the substrate, the layer (or film), the region, the pad, or the patterns, or intervening layers may also be present. Also, Further, the reference about 'on' and 'under' each layer will be made on the basis of the drawings.

In the drawings, the dimension of each of elements may be exaggerated for clarity of illustration, and the dimension of each of the elements may be different from the actual dimension of each of the elements.

Hereinafter, a light emitting device and a method for manufacturing the same will be described with reference to the accompanying drawings.

Figure 2:
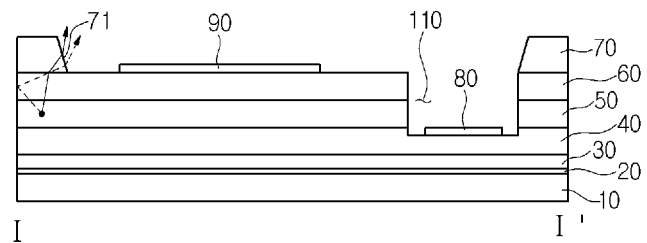
FIG. 2 is a cross-sectional view taken along line I-I' of the light emitting diode according to the first embodiment.

FIG. 1 is a perspective view of a light emitting diode according to a first embodiment. FIG. 2 is a cross-sectional view taken along line I-I' of the light emitting diode according to the first embodiment.

Referring to FIGS. 1 and 2, a light emitting diode according to a first embodiment may include a substrate 10, a buffer layer 20, an undoped GaN layer 30, a first conductive type semiconductor layer 40, an active layer 50, and a second conductive type semiconductor layer 60.

A first electrode layer 80 may be formed on the first conductive type semiconductor layer 40, and a second electrode layer 90 may be formed on the second conductive type semiconductor layer 60.

Although not shown, a third conductive type impurity layer doped with a first conductive type impurity may be formed on the second conductive type semiconductor layer 60.

The light emitting diode according to the first embodiment may include an opening 110 to form the first electrode layer 80 therein. The opening 110 may be formed by selectively removing the second conductive type semiconductor layer 60, the active layer 50, and the first conductive type semiconductor layer 40.

The upper side of the first conductive type semiconductor layer 40 may be exposed by the opening 110, and then the first electrode layer 80 may be formed on the first conductive type semiconductor layer 40.

Although not shown, the first electrode layer 80 and the second electrode layer 90 may be electrically connected to an external power source. Also, an ohmic contact layer may be formed between the second conductive type semiconductor layer 60 and the second electrode layer 90. The ohmic contact layer may be formed with a transparent electrode.

A light extraction layer 70 may be formed on the second conductive type semiconductor layer 60.

The light extraction layer 70 may be formed on a peripheral portion of the second conductive type semiconductor layer 60. Accordingly, the light extraction layer 70 may be disposed to surround the exposed portion of the second conductive type semiconductor layer 60 and the opening 110.

The light extraction layer 70 may also be formed on all of the peripheral portions of the second conductive type semiconductor layer 60.

The side surface of the light extraction layer 70 may be formed on the same vertical plane as the side surface of the second conductive type semiconductor layer 60.

The light extraction layer 70 may allow light from the active layer 50 to be emitted to the outside more efficiently.

The light extraction layer 70 may be formed to have an inclined surface 71 in an upwardly exposed direction of the second conductive type semiconductor layer 60. The inclined surface 71 may be inclined at an angle of about 58 degrees to about 63 degrees with respect to the upper surface of the second conductive type semiconductor layer 60.

The light extraction layer 70 may be formed to have a refractive index smaller than or equal to that of the second conductive type semiconductor layer 60. For example, the second conductive type semiconductor layer 60 may be formed of GaN, and may have a refractive index of about 2.33 with respect to light having a wavelength of about 450 nm. The light extraction layer 70 may be formed of $Al_xGa_{1-x}N$ ($0 \leq x \leq 1$), and may have a refractive index of about 2.12 to about 2.33 with respect to light having a wavelength of 450 nm. The light extraction layer 70 may be formed of AlGaN.

As shown by the arrow in FIG. 1, since the light extraction layer 70 having a refractive index smaller than or equal to that of the second conductive type semiconductor layer 60 is formed on the second conductive type semiconductor layer 60, there is an increased possibility that light generated in the active layer 50 may be reflected by the upper surface of the second conductive type semiconductor layer 60 to be emitted to the outside without being again incident to the inside. Particularly, the inclined surface 71 of the light extraction layer 70 may allow the light to be emitted in the upward direction more smoothly.

Although not shown, the ohmic contact layer may be formed between the second conductive type semiconductor layer 60 and the light extraction layer 70.

Figure 3:
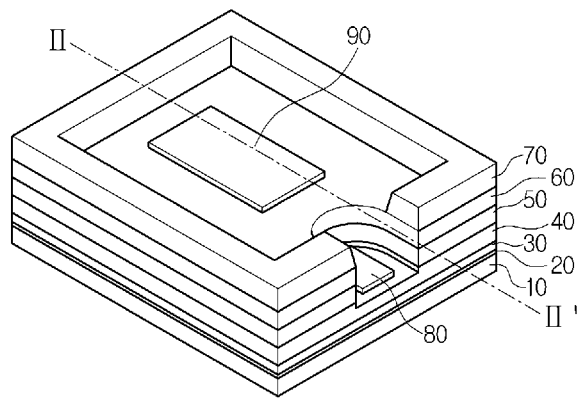
FIG. 3 is a perspective view of a light emitting diode according to a second embodiment.
Figure 4:
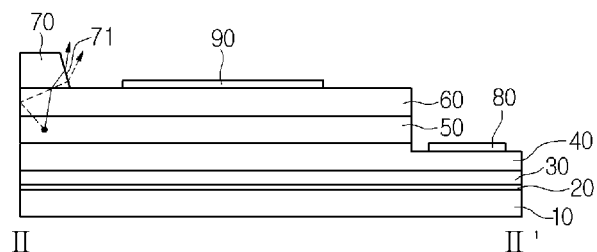
FIG. 4 is a cross-sectional view taken along line II-II' of the light emitting diode according to the second embodiment.

FIG. 3 is a perspective view of a light emitting diode according to a second embodiment. FIG. 4 is a cross-sectional view taken along line II-II' of the light emitting diode according to the second embodiment.

Referring to the FIGS. 3 and 4, the light emitting diode according to the second embodiment may be similar to the light emitting diode described in the first embodiment.

However, there is a difference in that the light emitting diode according to the first embodiment is formed to have the opening 110 exposing the first conductive type semiconductor layer 40 upwardly to form the first electrode layer 80, while the light emitting diode according to the second embodiment is formed to have the opening 110 of FIG. 1 to be opened in the direction of the side surface as well.

For this, portions of the second conductive type semiconductor layer 60, the active layer 50, the first conductive type semiconductor layer 40, and the light extraction layer 70 may be selectively removed.

The light emitting diode according to the second embodiment has an advantage in that a process for electrically connecting the first electrode layer 80 to an external power source through a wire can be more easily performed.

FIGS. 5 through 10 are views illustrating a method for manufacturing a light emitting diode according to an embodiment.

Figure 5:
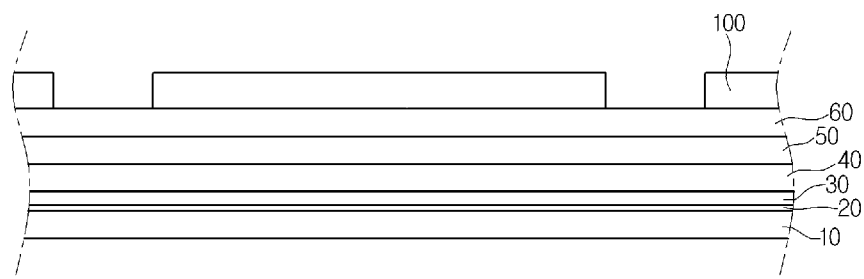
FIGS. 5 through 10 are views illustrating a method for manufacturing a light emitting diode according to an embodiment.

Referring to FIG. 5, a buffer layer 20, an undoped GaN layer 30, a first conductive type semiconductor layer 40, an active layer 50, and a second conductive type semiconductor layer 60 may be formed on a substrate 10. A mask layer 100 may be formed on the second conductive type semiconductor layer 60 to form a light extraction layer 70.

For example, the substrate 10 may be formed of at least one of $Al_2O_3$, Si, SiC, GaAs, ZnO, and MgO.

The buffer layer 20 may reduce a difference in the lattice constants between the substrate 10 and the nitride semiconductor layer stacked over the substrate, and may be formed in a stacked structure of materials such as AlInN/GaN, $In_xGa_{1-x}N/GaN$, and $Al_xIn_yGa_{1-x-y}N/In_xGa_{1-x}N/GaN$.

The undoped GaN layer 30 may be formed by injecting a gas including $NH_3$ and TMGa into a chamber.

The first conductive type semiconductor layer 40 may be a nitride semiconductor layer doped with a first conductive type impurity. For example, the first conductive type impurity may be an n-type impurity. The first conductive type semiconductor layer 40 may be formed of a GaN layer including Si as an n-type impurity.

The active layer 50 may be formed in a single quantum well structure or a multi-quantum well structure. For example, the active layer 50 may be formed in a stacked structure of InGaN well layer/GaN barrier layer.

The second conductive type semiconductor layer 60 may be a nitride semiconductor layer doped with a second conductive type impurity. For example, the second conductive type impurity may be a p-type impurity. The second conductive type semiconductor layer 60 may be formed of a GaN layer including Mg as a p-type impurity.

A third conductive type semiconductor layer (not shown) may be a nitride semiconductor layer doped with a first conductive type impurity. For example, the first conductive type impurity may include an n-type impurity such as Si.

The mask layer 100 may be formed of a silicon oxide ($SiO_2$). The mask layer 100 may be patterned to form the light extraction layer 70 according to an embodiment.

Figure 6:
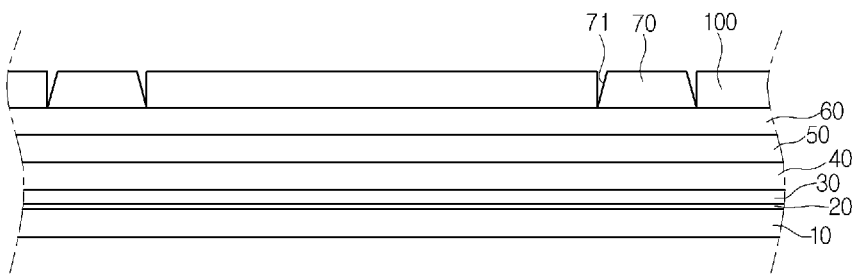

Referring to FIG. 6, the light extraction layer 70 may be formed on the second conductive type semiconductor layer 60 after the mask layer 100 is formed.

The light extraction layer 70 may be formed of $Al_xGa_{1-x}N$ ($0 \leq x \leq 1$). For example, the $Al_xGa_{1-x}N$ may be formed by supplying $NH_3$, TMGa and TMAl at a temperature of about 800° C. to about 1,000° C. For example, the light extraction layer 70 may be formed of AlGaN.

The light extraction layer 70 may be formed to have an inclined surface 71 inclined at an angle of about 58 degrees to about 63 degrees with respect to the upper surface of the second conductive type semiconductor layer 60 during growth process.

Figure 7:
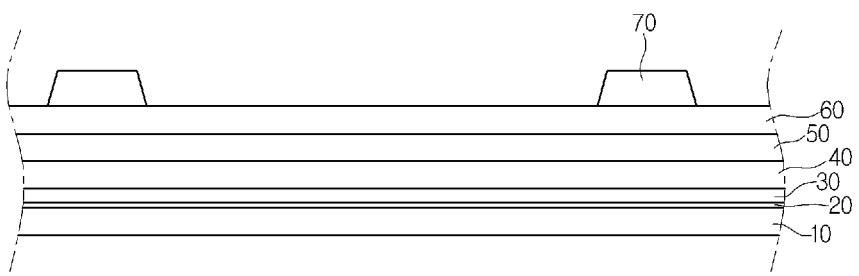

The mask layer 100 may be removed as shown in FIG. 7.

Figure 8:
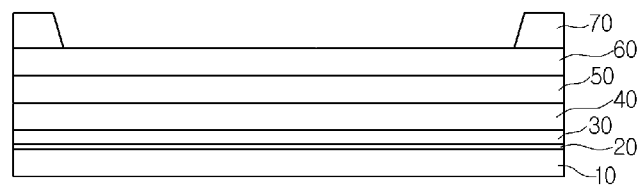

Referring to FIG. 8, a scribing process may be performed around the light extraction layer 70.

The scribing process is to divide a semiconductor layer into pieces to make a plurality of light emitting devices. While a cross-sectional view has been illustrated in FIG. 8, the semiconductor layer may be divided in a shape similar to a cube as shown in FIGS. 1 and 3.

Accordingly, the light extraction layer 70 may be disposed on the peripheral portion of the second conductive type semiconductor layer 60. The side surface of the light extraction layer 70 may be formed on the same vertical plane as the side surface of the second conductive type semiconductor layer 60.

Here, an ohmic contact layer (not shown) may be formed on the second conductive type semiconductor layer 60, and then the mask layer 100 may be formed on the ohmic contact layer. Thereafter, the light extraction layer 70 may be formed over the ohmic contact layer.

Alternatively, after the light extraction layer 70 is formed on the second conductive type semiconductor layer 60, the ohmic contact layer may be formed on the second conductive type semiconductor layer 60 on which the light extraction layer 70 is not formed.

Figure 9:
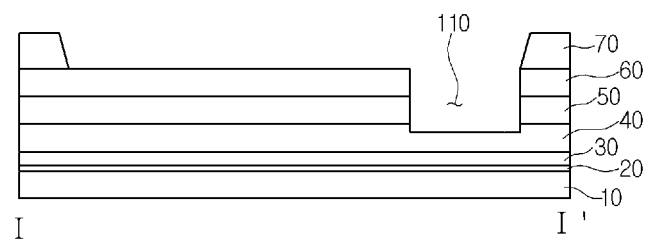

Referring to FIG. 9, a mask pattern (not shown) may be formed over the second conductive type semiconductor layer 60 and the light extraction layer 70 described in FIG. 8, and then the second conductive type semiconductor layer 60, the active layer 50, and the first conductive type semiconductor layer 40 may be selectively etched to form the opening 110 as described in FIGS. 1 and 2.

Alternatively, the light extraction layer 70, the second conductive type semiconductor layer 60, the active layer 50, and the first conductive type semiconductor layer 40 may be selective etched along the mask pattern to form the opening as described in FIGS. 3 and 4.

Figure 10:
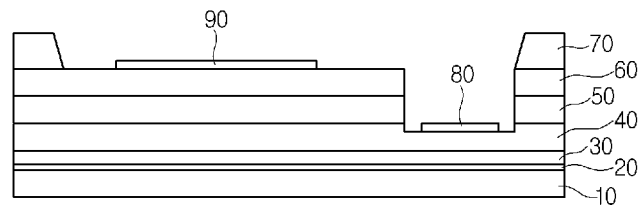

Referring to FIG. 10, a first electrode layer 80 may be formed on the first conductive type semiconductor layer 40, and then a second electrode layer 90 may be formed on the second conductive type semiconductor layer 60.

Accordingly, a light emitting diode can be manufactured as described in FIG. 1.

Thereafter, a process for electrically connecting the first and second electrode layers 80 and 90 to an external power source through a wire may be performed, and a process for forming a molding member on the second conductive type semiconductor layer 60 and the light extraction layer 70 may be performed.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiments can be applied to light emitting devices used as a light source.

The invention claimed is:

1. A light emitting device comprising:
a first conductive type semiconductor layer;
an active layer on the first conductive type semiconductor layer;
a second conductive type semiconductor layer on the active layer;
a first electrode layer on the first conductive type semiconductor layer;
a second electrode layer on the second conductive type semiconductor layer; and
a light extraction layer on the second conductive type semiconductor layer, and
wherein the second conductive type semiconductor layer includes a first portion having a center area of the second conductive type semiconductor layer and a second portion having an edge area of the second conductive type semiconductor layer,
wherein the second electrode layer is in contact with a top surface of the first portion of the second conductive type semiconductor layer,
wherein the light extraction layer is disposed on the second portion of the second conductive type semiconductor layer,
wherein the light extraction layer includes a first wall, a second wall and a third wall, and
wherein at least two of the walls have an inner surface inclined at an acute angle wherein the light extraction layer comprises $Al_xGa_{1-x}N$ ($0 \leq x \leq 1$).

2. The light emitting device according to claim 1, wherein the light extraction layer having a refractive index smaller than or equal to a refractive index of the second conductive type semiconductor layer.

3. The light emitting device according to claim 1, wherein the light extraction layer comprises AlGaN.

4. The light emitting device according to claim 1, wherein the first electrode layer is disposed in an opening that is formed by selectively removing the second conductive type semiconductor layer, the active layer and the first conductive type semiconductor layer.

5. The light emitting device according to claim 1, wherein the light extraction layer is formed to surround the first electrode layer and the second electrode layer along the peripheral region of the second conductive type semiconductor layer.

6. The light emitting device according to claim 1, wherein the light extraction layer and the second electrode layer are separated each other on the surface of the second conductive type semiconductor layer.

7. The light emitting device according to claim 1, wherein each inner surface is inclined at an angle of about 58 degrees to about 63 degrees with respect to the upper surface of the second conductive type semiconductor layer.

8. The light emitting device according to claim 4, wherein the first electrode layer and the first conductive type semiconductor layer in the opening are upwardly exposed.

9. The light emitting device according to claim 1, wherein the first conductive type semiconductor layer which the first electrode layer is disposed at is upwardly and laterally exposed.

10. The light emitting device according to claim 1, comprising an area that is removed from the light extraction layer to a part of the first conductive type semiconductor layer.

11. The light emitting device according to claim 1, wherein the lateral side surfaces of the light extraction layer, the second conductive type semiconductor layer, the active layer, and the first conductive type semiconductor layer are arranged on the same vertical plane.

12. The light emitting device according to claim 1, comprising an ohmic contact layer between the second conductive type semiconductor layer and the second electrode layer.

13. The light emitting device according to claim 1, comprising a third conductive type semiconductor layer on the second conductive type semiconductor layer, the third conductive type semiconductor layer being doped with an n-type impurity.

14. The light emitting device according to claim 1, wherein an upper surface of the light extraction layer is even.

15. The light emitting device according to claim 1, wherein a first conductive type semiconductor layer is an N type semiconductor layer and the second conductive type semiconductor layer is a P type semiconductor layer.

16. A light emitting device comprising:
a substrate;
a first conductive type semiconductor layer on the substrate;
an active layer on the first conductive type semiconductor layer;
a second conductive type semiconductor layer on the active layer;
a first electrode layer on the first conductive type semiconductor layer;
a second electrode layer on the second conductive type semiconductor layer; and
a light extraction layer on the second conductive type semiconductor layer,
wherein the second conductive type semiconductor layer includes a first portion having a center area of the second conductive type semiconductor layer and a second portion having an edge area of the second conductive type semiconductor layer,
wherein the second electrode layer is disposed on the first portion of the second conductive type semiconductor layer,
wherein the light extraction layer has a wall disposed on the second portion of the second conductive type semiconductor layer and is not disposed on the first portion of the second conductive type semiconductor layer, and
wherein the wall of the light extraction layer has an inner side surface inclined at an acute angle wherein the light extraction layer comprises $Al_xGa_{1-x}N$ ($0 \leq x \leq 1$).

17. The light emitting device according to claim 16, wherein the light extraction layer and the second electrode layer are directly contacted with the second conductive type semiconductor layer.

18. A light emitting device comprising:
a substrate;
a first conductive type semiconductor layer on the substrate;
an active layer on the first conductive type semiconductor layer;
a second conductive type semiconductor layer on the active layer;
a first electrode layer on the first conductive type semiconductor layer;
a second electrode layer on the second conductive type semiconductor layer; and
a light extraction layer on the second conductive type semiconductor layer,
wherein a top surface of the second conductive type semiconductor layer includes a first portion that the light extraction layer is not formed and a second portion,
wherein the light extraction layer has a wall disposed on the second portion of the second conductive type semiconductor layer,
wherein the wall of the light extraction layer includes an inclined side surface, and
wherein the light extraction layer has a central opening and a peripheral opening wherein the light extraction layer comprises $Al_xGa_{1-x}N$ ($0 \leq x \leq 1$).

* * * * *